United States Patent
Li

(10) Patent No.: US 11,984,021 B2
(45) Date of Patent: May 14, 2024

(54) INFRARED REMOTE CONTROL CODE MATCHING METHOD AND APPARATUS, COMPUTER DEVICE, AND READABLE STORAGE MEDIUM

(71) Applicant: HANGZHOU TUYA INFORMATION TECHNOLOGY CO., LTD., Zhejiang (CN)

(72) Inventor: Lanfeng Li, Zhejiang (CN)

(73) Assignee: HANGZHOU TUYA INFORMATION TECHNOLOGY CO., LTD., Zhejiang (CN)

( * ) Notice: Subject to any disclaimer, the term of this patent is extended or adjusted under 35 U.S.C. 154(b) by 296 days.

(21) Appl. No.: 17/539,228

(22) Filed: Dec. 1, 2021

(65) Prior Publication Data

US 2022/0215746 A1 Jul. 7, 2022

(30) Foreign Application Priority Data

Jan. 4, 2021 (CN) .......................... 202110002067.9

(51) Int. Cl.
*G08C 23/04* (2006.01)
*H03M 7/30* (2006.01)

(52) U.S. Cl.
CPC .......... *G08C 23/04* (2013.01); *H03M 7/3068* (2013.01); *H03M 7/6011* (2013.01); *G08C 2200/00* (2013.01); *G08C 2201/20* (2013.01)

(58) Field of Classification Search
CPC ................ G08C 23/04; G08C 2200/00; G08C 2201/20; G08C 19/28; H03M 7/3068; H03M 7/6011; H04L 12/2816

See application file for complete search history.

(56) References Cited

U.S. PATENT DOCUMENTS

| 10,361,802 B1 * | 7/2019 | Hoffberg-Borghesani ................. G06F 3/00 |
| 2020/0314682 A1 * | 10/2020 | Chen ...................... H04L 1/0014 |
| 2022/0077875 A1 * | 3/2022 | He ......................... H04L 1/0064 |

FOREIGN PATENT DOCUMENTS

| CN | 102467816 A | * | 5/2012 | |
| CN | 105225464 A | | 1/2016 | |
| CN | 105427577 A | * | 3/2016 | ............. G08C 23/04 |
| CN | 105427577 A | | 3/2016 | |
| CN | 105702014 A | * | 6/2016 | |

(Continued)

*Primary Examiner* — Adnan Aziz
(74) *Attorney, Agent, or Firm* — Samson G. Yu

(57) ABSTRACT

The present disclosure relates to an infrared remote control code matching method and apparatus, a computer device, and a readable storage medium. The method includes that: an infrared remote control code stream is acquired; a data region of the infrared remote control code stream is divided into multiple data subregions according to occurrence frequencies of the code data in the infrared remote control code stream; an encoding process is performed on each piece of code data in the infrared remote control code stream according to a size of each piece of code data in the infrared remote control code stream and the multiple data subregions to obtain an encoded stream; and the encoded stream is matched with an encoded infrared remote control code stream recorded in an infrared remote control code library to find a corresponding infrared remote control code stream from the infrared remote control code library.

20 Claims, 3 Drawing Sheets

(56) References Cited

FOREIGN PATENT DOCUMENTS

| | | | | |
|---|---|---|---|---|
| CN | 105702014 | A | 6/2016 | |
| CN | 105070035 | B | 5/2018 | |
| CN | 108694826 | A | 10/2018 | |
| CN | 109428602 | A * | 3/2019 | .......... H03M 7/3068 |
| CN | 109428602 | A | 3/2019 | |

* cited by examiner

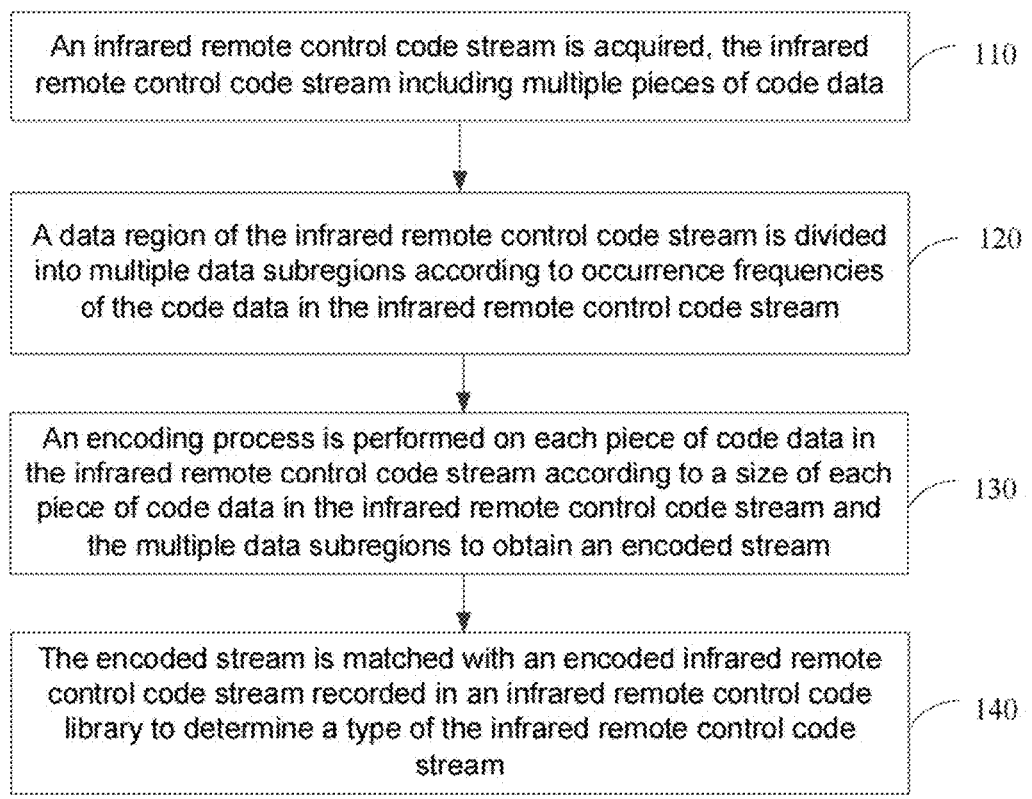

| Volue | cnt | Percent | Cumulative percent | Lower limit | Upper limit |
|---|---|---|---|---|---|
| 450 | 140 | 5.56% | 5.56% | | |
| 500 | 967 | 38.43% | 44.00% | 400 | 600 |
| 550 | | 21.34% | 65.34% | 525 | |
| 600 | | 2.11% | 67.45% | 420 | 630 |
| 650 | 20 | 0.79% | 68.24% | | |
| 1650 | | 1.71% | 69.95% | | |
| 1700 | 454 | 18.04% | 87.99% | 1500 | 1800 |
| 1750 | | 1.79% | 89.78% | | |
| 1800 | | 0.08% | 89.86% | | |
| 2200 | 6 | 0.24% | 90.10% | | |
| 2250 | 38 | 1.51% | 91.61% | | |
| 2300 | 7 | 0.28% | 91.89% | | |
| 4500 | 33 | 1.31% | 93.20% | | |
| 4550 | 1 | 0.04% | 93.24% | | |
| 8850 | 2 | 0.08% | 93.32% | | |
| 8900 | 62 | 2.46% | 95.79% | | |
| 8950 | 21 | 0.83% | 96.62% | | |
| 39700 | 2 | 0.08% | 96.70% | | |
| 39750 | 29 | 1.15% | 97.85% | | |
| 39800 | 3 | 0.12% | 97.97% | | |
| 48978 | 34 | 1.35% | 99.32% | | |
| 62000 | 17 | 0.68% | 100.00% | | |

Fig. 5
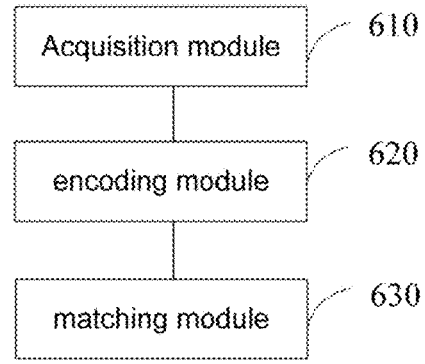
Fig. 6
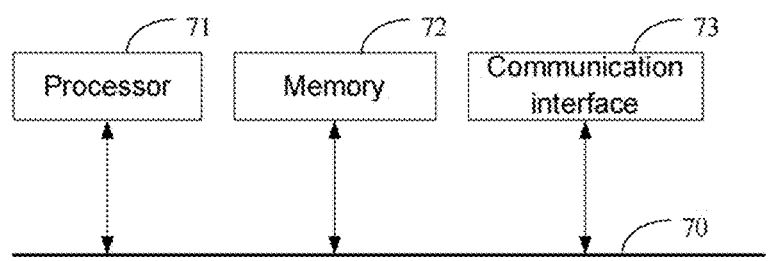
Fig. 7

INFRARED REMOTE CONTROL CODE MATCHING METHOD AND APPARATUS, COMPUTER DEVICE, AND READABLE STORAGE MEDIUM

TECHNICAL FIELD

The present disclosure relates to the field of smart home, and particularly to an infrared remote control code matching method and apparatus, a computer device, and a readable storage medium.

BACKGROUND

At present, with the emergence of increasingly rich smart home devices on the market, infrared remote controllers of various manufacturers, brands and products have also been applied more and more extensively, codes corresponding to different infrared remote controllers being similar and different. In addition, an infrared code may fluctuate in a certain range in a sending and receiving process under the influence of an external environment. Although a large number of infrared codes may be learned according to a self-learning function of the infrared remote controller, it is still difficult to rapidly match a device button and an infrared code in an infrared code library.

Conventional infrared code matching is implemented by continuous code sending and testing under manual intervention. Alternatively, similarities between infrared remote control codes are calculated by hard computing, which, however, consumes relatively long time.

SUMMARY

The present disclosure provides an infrared remote control code matching method and apparatus, a computer device and a readable storage medium, to at least solve the problem of high time consumption in the matching of a remote controller and an infrared remote control code in a related art.

According to a first aspect, an embodiment of the present disclosure provides an infrared remote control code matching method, which includes that:

an infrared remote control code stream is acquired, the infrared remote control code stream including multiple pieces of code data;

an occurrence frequency of each piece of code data in the infrared remote control code stream is statistically obtained, and a data region covered by the infrared remote control code stream is divided into multiple data subregions according to the occurrence frequency of each piece of code data in the infrared remote control code stream;

an encoding process is performed on the each piece of code data in the infrared remote control code stream according to a size of the each piece of code data in the infrared remote control code stream and the multiple data subregions to obtain an encoded stream; and the encoded stream is matched with an encoded infrared remote control code stream recorded in an infrared remote control code library to find a corresponding infrared remote control code stream from the infrared remote control code library.

In some embodiments, the operation that a data region of the infrared remote control code stream is divided into multiple data subregions according to occurrence frequencies of the code data in the infrared remote control code stream includes that:

first code data and second code data are selected from the infrared remote control code stream according to the occurrence frequencies of the code data in the infrared remote control code stream;

four pieces of partitioning code data are obtained according to the first code data, the second code data and a preset offset; and the data region of the infrared remote control code stream is divided into five continuous data subregions according to sizes of the four pieces of partitioning code data.

In some embodiments, the operation that first code data and second code data are selected from the infrared remote control code stream according to the occurrence frequencies of the code data includes that:

code data corresponding to a maximum occurrence frequency is selected from the infrared remote control code stream as first high-frequency code data;

a first interval is obtained according to the first high-frequency code data and the preset offset, a first mean value of all code data in the first interval is calculated, and the first mean value is determined as the first code data;

all the code data in the first interval is rejected from the infrared remote control code stream, and code data corresponding to a maximum occurrence frequency in the infrared remote control code stream remaining after rejection is calculated as second high-frequency code data; and a second interval is obtained according to the second high-frequency code data and the preset offset, a second mean value of all code data in the second interval is calculated, and the second mean value is determined as the second code data.

In some embodiments, the operation that four pieces of partitioning code data are obtained according to the first code data, the second code data and a preset offset includes that:

a first upper limit value and first lower limit value of a fluctuation range of the first code data are obtained according to the first code data and the preset offset; and a second upper limit value and second lower limit value of a fluctuation range of the second code data are obtained according to the second code data and the preset offset.

In some embodiments, the preset offset is 5% to 20%.

In some embodiments, the operation that the encoded stream is matched with the encoded infrared remote control code stream recorded in an infrared remote control code library includes that:

a fluctuation range of code data in the encoded stream is compared with a fluctuation range of third code data, the third code data being code data of the encoded infrared remote control code stream recorded in the infrared remote control code library; and comparison is performed to determine whether the code data in the encoded stream is matched with the encoded infrared remote control code stream recorded in the infrared remote control code library if the fluctuation range of the code data in the encoded stream is in the fluctuation range of the third code data.

In some embodiments, after the operation that an infrared remote control code stream is acquired, the method further includes that:

the infrared remote control code stream is preprocessed, a preprocessing manner including smoothing.

According to a second aspect, an embodiment of the present disclosure provides an infrared remote control code matching apparatus, which includes:

an acquisition module, configured to acquire an infrared remote control code stream, the infrared remote control code stream including multiple pieces of code data;

an encoding module, configured to divide a data region of the infrared remote control code stream into multiple data subregions according to occurrence frequencies of the code data in the infrared remote control code stream, and perform an encoding process on the each piece of code data in the infrared remote control code stream according to a size of the each piece of code data in the infrared remote control code stream and the multiple data subregions to obtain an encoded stream; and a matching module, configured to match the encoded stream and an encoded infrared remote control code stream recorded in an infrared remote control code library to find a corresponding infrared remote control code stream from the infrared remote control code library.

According to a third aspect, an embodiment of the present disclosure provides a computer device, which includes a memory, a processor and a computer program stored in the memory and capable of running in the processor, the processor executing the computer program to implement the infrared remote control code matching method as described in the first aspect.

According to a fourth aspect, an embodiment of the present disclosure provides a computer-readable storage medium having stored therein a computer program which is executed by a processor to implement the infrared remote control code matching method as described in the first aspect.

Compared with the related art, the infrared remote control code matching method provided in the embodiment of the present disclosure includes that: an infrared remote control code stream is acquired, the infrared remote control code stream including multiple pieces of code data; a data region of the infrared remote control code stream is divided into multiple data subregions according to occurrence frequencies of the code data in the infrared remote control code stream; an encoding process is performed on the each piece of code data in the infrared remote control code stream according to a size of the each piece of code data in the infrared remote control code stream and the multiple data subregions to obtain an encoded stream; and the encoded stream is matched with an encoded infrared remote control code stream recorded in an infrared remote control code library to find a corresponding infrared remote control code stream from the infrared remote control code library. The problem of high time consumption in the matching of a remote controller and an infrared remote control code in the related art is solved.

Details about one or more embodiments of the present disclosure are presented in the following drawings and descriptions to make the other features, objectives and advantages of the present disclosure clear and easy to understand.

BRIEF DESCRIPTION OF THE DRAWINGS

The drawings described herein are used to provide a further understanding to the present disclosure and form a part of the present disclosure. Schematic embodiments of the present disclosure and descriptions thereof are used to explain the present disclosure and not intended to form improper limits to the present disclosure. In the drawings:

FIG. 1 is a flowchart of an infrared remote control code matching method according to an embodiment;

FIG. 2 is a schematic diagram of an infrared remote control code stream corresponding to a certain remote controller according to an embodiment;

FIG. 5 is a schematic diagram of an encoded stream according to an embodiment;

FIG. 6 is a structure block diagram of an infrared remote control code matching apparatus according to an embodiment; and FIG. 7 is an internal structure diagram of a computer device according to an embodiment.

DETAILED DESCRIPTION OF THE EMBODIMENTS

Figures 3, 4:
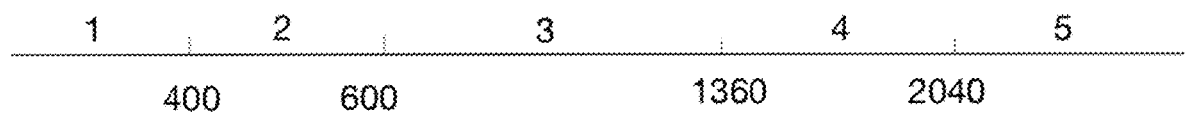
FIG. 3 is a schematic diagram of frequent items of first code data and second code data of a certain remote controller according to an embodiment.
FIG. 4 is a schematic diagram of data subregions obtained by division according to an embodiment.

In order to make the objectives, technical solutions and advantages of the present disclosure clearer, the following further describes and illustrates the present disclosure in combination with the drawings and embodiments. It should be understood that the specific embodiments described herein are adopted only to explain rather than limit the present disclosure. All other embodiments obtained by those of ordinary skill in the art based on the embodiments provided in the present disclosure without creative work shall fall within the scope of protection of the present disclosure.

It is apparent that the drawings in the following description are only some examples or embodiments of the present disclosure. Those of ordinary skill in the art may further apply the present disclosure to other similar scenes according to these drawings without creative work. In addition, it can also be understood that, although efforts made in such a development process may be complex and tedious, some design, manufacturing or production variations, etc., made by those of ordinary skill in the art related to the contents disclosed in the present disclosure based on the technical contents disclosed in the present disclosure are only conventional technical means and it should not be understood that the contents disclosed in the present disclosure are incomplete.

"Embodiment" mentioned in the present disclosure means that a specific feature, structure or property described in combination with an embodiment may be included in at least one embodiment of the present disclosure. The phrase appearing anywhere in the specification does not always refer to the same embodiment or an independent or alternative embodiment mutually exclusive of another embodiment. It is explicitly and implicitly understood by those of ordinary skill in the art that the embodiments described in the present disclosure may be combined with the other embodiments without conflicts.

The technical terms or scientific terms involved in the present disclosure should have the same meanings as commonly understood by those of ordinary skill in the technical art the present disclosure belongs to, unless otherwise defined. "One", "a/an", "a kind of", "the" and other similar words involved in the present disclosure do not form quantitative limitations and may represent a singular form or a plural form. Terms "include", "contain" and "have" involved in the present disclosure and any transformation thereof are intended to cover nonexclusive inclusions. For example, a process, method, system, product or device including a series of steps or modules (units) is not limited to listed steps or units but may further include steps or units which are not listed or other steps or units inherent in the process, the method, the system, the product or the device. "Connect", "mutually connected", "couple" and other similar words involved in the present disclosure are not limited to physical or mechanical connection but may include electrical connection, either direct or indirect. "Multiple" involved in the present disclosure refers to two or more than two. "And/or" describes an association relationship between associated objects and represents that three relationships may exist. For example, "A and/or B" may represent three conditions: i.e., independent existence of A, existence of both A and B and independent existence of B. Character "I" usually represents that previous and next associated objects form an "or" relationship. Terms "first", "second", "third" and the like involved in the present disclosure are only for distinguishing similar objects and do not represent a specific sequence of the objects.

FIG. 1 illustrates an infrared remote control code matching method according to an embodiment. As shown in FIG. 1, the infrared remote control code matching method includes Step 110 to Step 140.

In Step 110, an infrared remote control code stream is acquired, the infrared remote control code stream including multiple pieces of code data.

At present, types of infrared remote control codes vary widely, different encoding modes are used for remote controllers of different brands and types, and types of some infrared remote control codes are customized by manufacturers. Therefore, corresponding infrared remote control code streams are different, to distinguish different remote controllers. As at least one alternative embodiment, infrared remote control codes of each type include multiple frames of infrared remote control code streams corresponding to functions of multiple remote controllers. For example, the infrared remote control code stream of a first frame corresponds to volume up, and the remote control code stream of a second frame corresponds to volume down. The infrared remote control code stream of each frame has multiple continuous code pulses, and each code pulse includes alternate high levels and low levels. Since the level is a high level when an infrared receiver is idle, it is determined that there is an infrared code stream when a low level is detected, and a header code of the infrared remote control code stream of each frame is a low level. Infrared remote control code streams of different types have different distributions of high and low levels, and infrared remote control code streams of the same type have the same distribution of high and low levels. That is, high-level durations and low-level durations of code pulses of different types are different. In the present disclosure, the high-level durations and the low-level durations are recorded by a timer, and the recorded high/low-level durations are taken as code data. For example, a first numerical value 8,900 in FIG. 2 corresponds to a low-level duration 8,900 us, and a second numerical value 4,500 corresponds to a high-level duration 4,500 us. FIG. 2 shows all code data under a certain remote controller.

In Step 120, an occurrence frequency of each piece of code data in the infrared remote control code stream is statistically obtained, and a data region covered by the infrared remote control code stream is divided into multiple data subregions according to the occurrence frequency of each piece of code data in the infrared remote control code stream.

In Step 130, an encoding process is performed on each piece of code data in the infrared remote control code stream according to a size of each piece of code data in the infrared remote control code stream and the multiple data subregions to obtain an encoded stream.

The whole infrared remote control code stream accords with a distribution rule of high and low levels. For example, first code data 8,900 in FIG. 2 is a low-level duration, second code data 4,500 is a high-level duration, and third code data 450 is a low-level duration, and the three alternate in sequence. It can be seen from FIG. 2 that, except a header code pulse, the other code data in the infrared remote control code stream substantially accords with such a condition that the low-level durations are relatively short, the high-level durations are relatively long, the low-level durations are concentrated in a data interval and the high-level durations are concentrated in another data interval. Referring to FIG. 2, the high-level durations are concentrated in a data interval of 1,750 to 1,800, and the low-level durations are concentrated in a data interval of 450 to 550. In the present disclosure, partitioning data is determined according to the occurrence frequencies of the code data in the infrared remote control code stream, i.e., frequencies of occurrence of the code data, the data region of the infrared remote control code stream is divided into multiple data subregions, and all the code data is divided into the corresponding data subregions according to sizes. Each data subregion corresponds to the same code value. A combination of the code values is the encoded stream.

In Step 140, the encoded stream is matched with an encoded infrared remote control code stream recorded in an infrared remote control code library to determine a type of the infrared remote control code stream.

At present, the infrared remote control code library stores almost all types of infrared remote control code streams. Since too many types of infrared remote control code streams are stored in the infrared remote control code library, rapidly matching an infrared remote control code type corresponding to a certain remote controller also becomes an important problem. It is to be noted that, in order to implement the rapid matching of the infrared mote control code library, it is necessary to encode the infrared remote control code stream in the infrared remote control code library according to the above-mentioned encoding mode and perform storage for subsequent rapid matching.

It is still difficult to rapidly match a button of a remote controller and an infrared remote control code in existing manners. As a first manner, continuous code sending and testing under manual intervention is relatively high in difficulty coefficient and low in efficiency, and a user abandons this function in many cases because no corresponding infrared remote control code is found. A second manner is to calculate similarities between infrared remote control codes by hard computing, which, however, consumes relatively long time.

Compared with a conventional art, the infrared remote control code matching method provided in the present disclosure includes that: an infrared remote control code stream is acquired, the infrared remote control code stream including multiple pieces of code data; a data region of the infrared remote control code stream is divided into multiple data subregions according to occurrence frequencies of the code data in the infrared remote control code stream; an encoding process is performed on each piece of code data in the infrared remote control code stream according to a size of each piece of code data in the infrared remote control code stream and the multiple data subregions to obtain an encoded stream; and the encoded stream is matched with an encoded infrared remote control code stream recorded in an infrared remote control code library to determine a type of the infrared remote control code stream. According to the method, the infrared remote control code stream is encoded to encode the infrared remote control code stream including the multiple pieces of code data into a character string formed by several fixed characters, and the encoded stream obtained by encoding is matched with the encoded infrared code stream stored in the infrared remote control code library. When a new infrared remote controller code is received, an encoded stream obtained by processing according to the above-mentioned algorithm may be rapidly matched with the infrared remote control code stream in the infrared remote control code library. Compared with the conventional manner of calculating similarities of codes one by one, the algorithm has the advantages that the efficiency of a test set is improved by nearly 250 times, a code matching function of the infrared remote control code library is greatly simplified, and a household remote controller may be matched rapidly.

In addition, in a practical business, an infrared remote control code fluctuates in a sending and receiving process under the influence of an external environment such as a temperature, a humidity, a network intensity and a distance, and thus code data in an infrared remote control code stream fluctuates in a certain range. For example, code data in a received code stream of a first frame in FIG. 2 is 550, but a level corresponding to a duration of 500 may be sent in a sending process. It is difficult to succeed in matching if an existing matching method is used for matching. In the present disclosure, the code data is encoded to encode code data in a preset fluctuation range into the same subregion, so that a matching failure caused by the influence of the external environment may be avoided, and the matching accuracy may be improved.

In some embodiments, the operation that a data region of the infrared remote control code stream is divided into multiple data subregions according to occurrence frequencies of the code data in the infrared remote control code stream includes that:

first code data and second code data are selected from the infrared remote control code stream according to the occurrence frequencies of the code data in the infrared remote control code stream;

four pieces of partitioning code data are obtained according to the first code data, the second code data and a preset offset; and the data region of the infrared remote control code stream is divided into five continuous data subregions according to sizes of the four pieces of partitioning code data.

As at least one alternative embodiment, the first code data may be acquired in the following manner. Code data corresponding to a maximum occurrence frequency is selected from the infrared remote control code stream as the first code data value1. Here, value1=500. A first interval is obtained by fluctuation according to the first code data value1 and the preset offset. Referring to FIG. 3, the code data corresponding to the maximum occurrence frequency in the infrared remote control code stream shown in FIG. 2 is 500 and occurs for 967 times in the infrared remote control code stream of the remote controller, accounting for 38.43%. In the embodiment, descriptions are made with an example that value1 is 500 and the preset offset is 20%. The first code data is increased and decreased by 20% to obtain upper-limit and lower-limit partitioning code data 500*(1-20%)=400 and 500*(1+20%)=600 of the first code data respectively.

The second code data is acquired in the following manner. All code data in the first interval is rejected. In the embodiment, all code data between 400 and 600 is rejected from the infrared remote control code stream. Then, code data value2 corresponding to a maximum occurrence frequency is selected from the infrared remote control code stream. Referring to FIG. 3, after all the code data between 400 and 600 is rejected from the infrared remote control code stream, value2 occurs for 454 times in the infrared remote control code stream of the remote controller, accounting for 18.04%. Here, value2=1,700 is the calculated second code data. A second interval is obtained by fluctuation according to the second code data value2 and the preset offset. In the embodiment, descriptions are made with an example that value2 is 1,700 and the preset offset is 20%. The second code data is increased and decreased by 20% to obtain partitioning code data 1,700*(1-20%)=1,360 and 1,700*(1+20%)=2,040 respectively.

After the four pieces of partitioning code data are obtained, the data region of the infrared remote control code stream is divided into five continuous data subregions according to the sizes of the four pieces of partitioning code data.

As shown in FIG. 4, after the four pieces of partitioning code data 400, 600, 1,360 and 2,040 are obtained, the data region of the infrared remote control code stream may be divided into the five data subregions of less than 400, 400 to 600, 600 to 1,360, 1,360 to 2,040 and greater than 2,040.

The code data in the five data subregions may be encoded in a unified manner to obtain the encoded stream after the data region of the infrared remote control code stream is divided into the five continuous data subregions. For example, the code data may be encoded into numerals 1, 2, 3, 4, and 5, or may be encoded into letters a, b, c, d and e. A specific encoding mode will not be specifically limited in the present disclosure. Descriptions are made in the present disclosure taking encoding into numerals as an example, as shown in FIG. 5.

In some embodiments, the operation that first code data and second code data are selected from the infrared remote control code stream according to the occurrence frequencies of the code data includes that:

code data corresponding to a maximum occurrence frequency is selected from the infrared remote control code stream as first high-frequency code data;

a first interval is obtained according to the first high-frequency code data and the preset offset, a first mean value of all code data in the first interval is calculated, and the first mean value is determined as the first code data;

all the code data in the first interval is rejected from the infrared remote control code stream, and code data corresponding to a maximum occurrence frequency is selected from the infrared remote control code stream remaining after rejection as second high-frequency code data; and a second interval is obtained according to the second high-frequency code data and the preset offset, a second mean value of all code data in the second interval is calculated, and the second mean value is determined as the second code data.

As at least one alternative embodiment, a code occurring most frequently is selected at first from the infrared remote control code stream as the first high-frequency code data m1. Since a remote controller may slightly fluctuate in a sending process, the offset in the embodiment is alph (e.g., 5%, 10% and 20%). A lower limit of fluctuation of m1 is recorded as m1*(1−alph), and an upper limit is recorded as m1*(1+alph). A mean value of code data in range [m1*(1−alph), m1*(1+alph)] is statistically obtained and recorded as the first code data.

The code data in range [m1*(1−alph), m1*(1+alph)] is rejected from the infrared remote control code stream. Occurrence frequencies of remaining code data are calculated to find and record code data occurring most frequently as the second high-frequency code data m2. A mean value of code data in [m2*(1−alph), m2*(1+alph)] is statistically obtained and recorded as the second code data.

In some embodiments, the operation that four pieces of partitioning code data are obtained according to the first code data, the second code data and a preset offset includes that: a first upper limit value and first lower limit value of a fluctuation range of the first code data are obtained according to the first code data and the preset offset; and a second upper limit value and second lower limit value of a fluctuation range of the second code data are obtained according to the second code data and the preset offset.

As at least one alternative embodiment, upper and lower limits of Top1 and Top2 are determined after the first code data Top1 and the second code data Top2 are obtained: upper and lower limits of a frequent power frequency of Top1 are [Top1*(1−alph), Top1*(1+alph)], and upper and lower limits of a frequent power frequency of Top2 are [Top2*(1−alph), Top2*(1+alph)]. The whole data region is divided into five parts according the four pieces of partitioning code data Top1*(1−alph), Top1*(1+alph), Top2*(1−alph) and Top2*(1+alph), which may be encoded into 12345 from the left to the right respectively. For each code of a certain remote controller, mapping is performed according to encoding to obtain different combinations of 12345 of each code.

In the embodiment, the mean value of the code data in the range of the first interval is determined as the first code data, and the mean value of the code data in the range of the second interval is determined as the second code data, so that the influence of fluctuation of the code data on encoding may be reduced, and the matching accuracy may further be improved.

In some embodiments, the preset offset is 5% to 20%, e.g., 5%, 10%, 15%, and 20%. Specific data may be set according to an environmental factor.

In some embodiments, the operation that the encoded stream is matched with the encoded infrared remote control code stream recorded in an infrared remote control code library includes that:

a fluctuation range of code data in the encoded stream is compared with a fluctuation range of third code data, the third code data being code data of the encoded infrared remote control code stream recorded in the infrared remote control code library; and comparison is performed to determine whether the code data in the encoded stream is matched with the encoded infrared remote control code stream recorded in the infrared remote control code library if the fluctuation range of the code data in the encoded stream is in the fluctuation range of the third code data.

If a fluctuation range of the first code data or a fluctuation range of the second code data is not in the fluctuation range of the code data in the infrared remote control code stream recorded in the infrared remote control code library, a mismatch is determined even though the encoded streams are matched.

For example, encoded streams of code data 100 5,000 100 100 5,000 stored in the infrared remote control code library and code data 500 7,000 500 500 7,000 sent by the remote controller are the same. However, a fluctuation range of the code data sent by the remote controller is not in a preset fluctuation range of the code data stored in the infrared remote control code library, so the fluctuation ranges are mismatched, and the code data is mismatched. It may be determined that matching succeeds if the fluctuation range of the code data of the remote controller is matched with the fluctuation range of the code data of the infrared remote control code stream recorded in the infrared remote control code library and the encoded streams are the same. Therefore, the matching accuracy may be improved.

When comparison is performed to determine whether the code data in the encoded stream is matched with the encoded infrared remote control code stream recorded in the infrared remote control code library, if a length of the code data in the encoded stream is different from that of the code stream recorded in the infrared remote control code library, for example, the length of the code stream in the encoded stream is 80 while the length of the code stream recorded in the infrared remote control code library is 100, the code data in the encoded stream may be compared with the first 80 pieces of code data in the code stream recorded in the infrared remote control code library, and it is determined that matching succeeds if the compared code data is matched.

In some other embodiments, standard code stream data under an ideal condition, i.e., unfluctuating code data free of environmental influence, may be stored in the infrared remote control code library. The standard code data is distributed in two data subregions after being encoded, e.g., data subregions corresponding to 2 and 4. An encoded stream obtained by encoding the standard code data of a certain frame is 4 2 2 2 4 2 4 2 2 2. Considering that code data to be matched in the infrared remote control code stream sent by the remote controller may fluctuate under the influence of an external environment, code data obtained by encoding may occur in data subregions corresponding to 1, 3 and 5. For example, an encoded stream obtained by encoding code data of a certain frame to be matched in the infrared remote control code stream sent by the remote controller is 4 3 2 2 4 2 4 2 2 2. In such case, a matching rule in the present disclosure may be set as that a match is determined if a mismatched amount is less than a preset amount. The preset amount may be set according to a length of the code stream. For example, the preset amount may be set to be 1%, 2%, 3%, etc., of a preset length. In addition, an offset and the mismatched amount may be combined for comprehensive judgment. For example, if the standard code data is 2 and the code data sent by the remote controller is 4, it is determined that the offset is relatively great. If the code data sent by the remote controller is 1 or 3, it is determined that the offset is relatively small. A weight is set according to a magnitude of the offset. A magnitude of the weight is directly proportional to that of the offset. A numerical value obtained by adding weights corresponding to all mismatched code data is compared with a preset threshold. A match is determined if the numerical value is less than the preset threshold. A mismatch is determined if the numerical value is not less than the preset threshold.

In some other embodiments, multiple frames of code streams in a preset fluctuation range may be stored in the infrared remote control code library. It is determined that matching succeeds when one frame of the stored code streams is matched with the received infrared remote control code stream in the fluctuation range. The preset fluctuation range may have the same meaning as the above-mentioned preset threshold, and a specific numerical value may be set according to a practical business scene.

If a corresponding infrared remote control code is not found in both a local memory and a cloud memory, it is determined that the infrared remote control code is not stored in the infrared remote control code library. In such case, the infrared remote control code library is updated to add the infrared remote control code and a corresponding device model and type into the infrared remote control code library, and the user does not need to input the device type and the device model again when pairing the same remote controller next time. Therefore, a pairing process of an infrared device is more intelligent.

In some embodiments, after the operation that an infrared remote control code stream is acquired, the method further includes that: the infrared remote control code stream is preprocessed, a preprocessing manner including smoothing.

During a practical engineering application, a sudden environmental change may often bring such a problem that an infrared remote control code stream includes excessive noises, for example, a jitter amplitude of code data is relatively high. The problem of matching failure may still be brought without smoothing. In the embodiment, the infrared remote control code stream is smoothed, so that code data that jitters greatly may be eliminated to solve the problem of code data jitter caused by sudden environmental changes and improve the matching accuracy. In the present disclosure, Moving Average (MA), Exponential Mean Average (EMA), Savitzky Golay (SG) filter, or the like is adopted for smoothing. The specific smoothing manner to be adopted will not be limited in the embodiment and may be set and selected independently by the user.

It is to be understood that, although each step in the flowchart in FIG. 1 is sequentially presented according to the indications of the arrowheads, these steps are not always executed according to the sequence indicated by the arrowheads. Unless clearly described herein, there are no strict limits made to the execution sequence of these steps and these steps may be executed in other sequences. Moreover, at least part of steps in FIG. 1 may include multiple sub-steps or multiple stages, these sub-steps or stages are not always executed and completed at the same time but may be executed at different time, and these sub-steps or stages are not always sequentially executed but may be executed in turn or alternately with at least part of other steps or sub-steps or stages of the other steps.

The embodiment also provides an infrared remote control code matching apparatus, which is configured to implement the above-mentioned embodiments and preferred implementation modes. What has been described will not be elaborated. Terms "module", "unit", "subunit" and the like used below may be a combination of software and/or hardware capable of realizing preset functions. Although the apparatus described in the following embodiment is preferably implemented with software, implementation with hardware or a combination of the software and the hardware is also possible and conceivable.

In an embodiment, as shown in FIG. 6, an infrared remote control code matching apparatus is provided, which includes:

an acquisition module 610, configured to acquire an infrared remote control code stream, the infrared remote control code stream including multiple pieces of code data;

an encoding module 620, configured to divide a data region of the infrared remote control code stream into multiple data subregions according to occurrence frequencies of the code data in the infrared remote control code stream, and perform an encoding process on each piece of code data in the infrared remote control code stream according to a size of each piece of code data in the infrared remote control code stream and the multiple data subregions to obtain an encoded stream; and a matching module 630, configured to match the encoded stream and an encoded infrared remote control code stream recorded in an infrared remote control code library to find a corresponding infrared remote control code stream from the infrared remote control code library.

According to the infrared remote control code matching apparatus provided in the embodiment, the acquisition module 610 acquires an infrared remote control code stream, the infrared remote control code stream including multiple pieces of code data; the encoding module 620 divides a data region of the infrared remote control code stream into multiple data subregions according to occurrence frequencies of the code data in the infrared remote control code stream and performs an encoding process on each piece of code data in the infrared remote control code stream according to a size of each piece of code data in the infrared remote control code stream and the multiple data subregions to obtain an encoded stream; and the matching module 630 matches the encoded stream and an encoded infrared remote control code stream recorded in an infrared remote control code library to find a corresponding infrared remote control code stream from the infrared remote control code library. The code data in the infrared remote control code stream may be encoded into a character string formed by several fixed characters according to the above-mentioned encoding mode, and then the encoded stream obtained by encoding is matched with the encoded infrared code stream stored in the infrared remote control code library. A new infrared remote controller code is rapidly matched with the infrared remote control code stream in the infrared remote control code library according to the above-mentioned algorithm when being received. Compared with the conventional manner of calculating similarities of codes one by one, the algorithm has the advantages that the efficiency of a test set is improved by nearly 250 times, a code matching function of the infrared remote control code library is greatly simplified, and a household remote controller may be matched rapidly.

In some embodiments, the encoding module 620 is further configured to select first code data and second code data from the infrared remote control code stream according to the occurrence frequencies of the code data in the infrared remote control code stream, obtain four pieces of partitioning code data according to the first code data, the second code data and a preset offset, and divide the data region of the infrared remote control code stream into five continuous data subregions according to sizes of the four pieces of partitioning code data.

In some embodiments, the encoding module 620 is further configured to: select code data corresponding to a maximum occurrence frequency from the infrared remote control code stream as first high-frequency code data; obtain a first interval according to the first high-frequency code data and the preset offset, calculate a first mean value of all code data in the first interval and determine the first mean value as the first code data; reject all the code data in the first interval from the infrared remote control code stream, and calculate code data corresponding to a maximum occurrence frequency in the infrared remote control code stream remaining after rejection as second high-frequency code data; and obtain a second interval according to the second high-frequency code data and the preset offset, calculate a second mean value of all code data in the second interval and determine the second mean value as the second code data.

In some embodiments, the encoding module 620 is further configured to obtain a first upper limit value and first lower limit value of a fluctuation range of the first code data according to the first code data and the preset offset and obtain a second upper limit value and second lower limit value of a fluctuation range of the second code data according to the second code data and the preset offset.

In some embodiments, the preset offset is 5% to 20%.

In some embodiments, the matching module 630 is further configured to compare a fluctuation range of the first code data, a fluctuation range of the second code data and a fluctuation range of third code data respectively, the third code data being code data of the encoded infrared remote control code stream recorded in the infrared remote control code library, and perform comparison to determine whether the code data in the encoded stream is matched with the encoded code data recorded in the infrared remote control code library if both the fluctuation range of the first code data and the fluctuation range of the second code data are in the fluctuation range of the third code data.

In some embodiments, the infrared remote control code matching apparatus further includes a preprocessing module, configured to preprocess the infrared remote control code stream acquired by the acquisition module 610, a preprocessing manner including smoothing.

Specific limits to the infrared remote control code matching apparatus may refer to the above limits to the infrared remote control code matching method, and will not be elaborated herein. All or part of the modules in the infrared remote control code matching apparatus may be implemented by software, hardware, and a combination thereof. Each module may be embedded in a hardware form into or independent of a processor in a computer device, or may be stored in a software form in a memory in the computer device, for the processor to call to execute the operations corresponding to each module.

In addition, the infrared remote control code matching method described in combination with FIG. 1 in the embodiment of the present disclosure may be implemented by a computer device. FIG. 7 is a hardware structure diagram of a computer device according to an embodiment of the present disclosure.

The computer device may include a processor 71 and a memory 72 storing a computer program instruction.

For example, the processor 71 may include a Central Processing Unit (CPU) or an Application Specific Integrated Circuit (ASIC), or may be configured into one or more integrated circuits implementing the embodiment of the present disclosure.

The memory 72 may include a bulk memory for data or instructions. As an example rather than a restriction, the memory 72 may include a Hard Disk Drive (HDD), a floppy disk drive, a Solid State Drive (SDD), a flash, an optical disk, a magneto-optical disk, a magnetic tape or Universal Serial Bus (USB) drive, or a combination of two or more than two of the above. The memory 72 may include a removable or unremovable (or fixed) medium if appropriate. The memory 72 may be inside or outside a data processing apparatus if appropriate. In a specific embodiment, the memory 72 is a non-volatile memory. In a specific embodiment, the memory 72 includes a Read-Only Memory (ROM) and a Random Access Memory (RAM). If appropriate, the ROM may be a mask programmable ROM, a Programmable ROM (PROM), an Erasable PROM (EPROM), an Electrically EPROM (EEPROM), an Electrically Alterable ROM (EAROM), a flash, or a combination of two or more than two of the above. If appropriate, the RAM may be a Static RAM (SRAM) or a Dynamic RAM (DRAM). The DRAM may be a Fast Page Mode DRAM (FPMDRAM), an Extended Data Out DRAM (EDODRAM), a Synchronous DRAM (SDRAM), etc.

The memory 72 may be configured to store or cache various data files required to be processed and/or used for communication and a possible computer program instruction executed by the processor 71.

The processor 71 reads and executes the computer program instruction stored in the memory 72 to implement any infrared remote control code matching method in the above-mentioned embodiment.

In some embodiments, the computer device may further include a communication interface 73 and a bus 70. As shown in FIG. 7, the processor 71, the memory 72 and the communication interface 73 are connected through the bus 70 to complete communications with one another.

The communication interface 73 is configured to implement communications between each module, apparatus, unit and/or device in the embodiment of the present disclosure. The communication interface 73 may further implement data communications with other components, e.g., an external device, an image/data acquisition device, a database, an external memory and an image/data processing workstation.

The bus 70 includes hardware, software or both, and couples the components of the computer device. The bus 70 includes, but not limited to, at least one of a data bus, an address bus, a control bus, an expansion bus, and a local bus. As an example rather than a restriction, the bus 70 may include an Accelerated Graphics Port (AGP) or another graphics bus, an Extended Industry Standard Architecture (EISA) bus, a Front Side Bus (FSB), a Hyper Transport (HT) interconnect, an Industry Standard Architecture (ISA) bus, an InfiniBand interconnect, a Low Pin Count (LPC) bus, a memory bus, a Micro Channel Architecture (MCA) bus, a Peripheral Component Interconnect (PCI) bus, a PCI-Express (PCI-X) bus, a Serial Advanced Technology Attachment (SATA) bus, a Video Electronics Standards Association Local Bus (VLB), another suitable bus, or a combination of two or more than two of the above. The bus 70 may include one or more buses in appropriate. Although a specific bus is described and shown in the embodiment of the present disclosure, any suitable bus or interconnect is considered in the present disclosure.

The computer device may execute the infrared remote control code matching method in the embodiment of the present disclosure based on the acquired program instruction, thereby implementing the infrared remote control code matching method described in combination with FIG. 7.

In addition, an embodiment of the present disclosure may provide a computer-readable storage medium, to implement the infrared remote control code matching method in the above-mentioned embodiment. The computer-readable storage medium has stored therein a computer program instruction which is executed by a processor to implement any infrared remote control code matching method in the above-mentioned embodiment.

Each technical feature of the above-mentioned embodiments may be freely combined. For brief description, not all possible combinations of each technical feature in the embodiments are described, but all combinations of these technical features shall fall within the scope recorded in the specification without conflicts.

The embodiments only express some implementation modes of the present disclosure, and relatively specific and detailed descriptions are made thereto but should thus not be understood as limits to the patent scope of the present disclosure. It is to be pointed out that those of ordinary skill in the art may further make a plurality of transformations and improvements without departing from the concept of the present disclosure and all of them fall within the scope of protection of the present disclosure. Therefore, the scope of protection of the patent application shall be subject to the appended claims.

What is claimed is:

1. An infrared remote control code matching method, comprising:

acquiring an infrared remote control code stream, the infrared remote control code stream comprising multiple pieces of code data;

statistically obtaining an occurrence frequency of each piece of code data in the infrared remote control code stream, and dividing a data region covered by the infrared remote control code stream into multiple data subregions according to the occurrence frequency of each piece of code data in the infrared remote control code stream;

performing an encoding process on the each piece of code data in the infrared remote control code stream according to a size of the each piece of code data in the infrared remote control code stream and the multiple data subregions to obtain an encoded stream; and matching the encoded stream and an encoded infrared remote control code stream recorded in an infrared remote control code library to find a corresponding infrared remote control code stream from the infrared remote control code library;

wherein dividing the data region of the infrared remote control code stream into the multiple data subregions according to the occurrence frequencies of the code data in the infrared remote control code stream comprises:

selecting first code data and second code data from the infrared remote control code stream according to the occurrence frequencies of the code data in the infrared remote control code stream;

obtaining four pieces of partitioning code data according to the first code data, the second code data and a preset offset; and dividing the data region of the infrared remote control code stream into five continuous data subregions according to sizes of the four pieces of partitioning code data;

wherein matching the encoded stream and the encoded infrared remote control code stream recorded in the infrared remote control code library comprises:

when a length of the code data in the encoded stream is different from a length of the encoded infrared remote control code stream recorded in the infrared remote control code library, comparing the code data in the encoded stream with code data of the encoded infrared remote control code stream of which the length is the same to the length of the code data in the encoded stream, in the encoded infrared remote control code stream recorded in the infrared remote control code library;

when a comparing result is a mismatched result, determining that the encoded stream is matched with the encoded infrared remote control code stream recorded in the infrared remote control code library.

2. The method according to claim 1, wherein selecting the first code data and the second code data from the infrared remote control code stream according to the occurrence frequencies of the code data comprises:

selecting code data corresponding to a maximum occurrence frequency from the infrared remote control code stream as first high-frequency code data;

obtaining a first interval according to the first high-frequency code data and the preset offset, calculating a first mean value of all code data in the first interval, and determining the first mean value as the first code data;

rejecting all the code data in the first interval from the infrared remote control code stream, and calculating code data corresponding to a maximum occurrence frequency in the infrared remote control code stream remaining after rejection as second high-frequency code data; and obtaining a second interval according to the second high-frequency code data and the preset offset, calculating a second mean value of all code data in the second interval, and determining the second mean value as the second code data.

3. The method according to claim 1, wherein obtaining the four pieces of partitioning code data according to the first code data, the second code data and the preset offset comprises:

obtaining a first upper limit value and first lower limit value of a fluctuation range of the first code data according to the first code data and the preset offset; and obtaining a second upper limit value and second lower limit value of a fluctuation range of the second code data according to the second code data and the preset offset.

4. The method according to claim 1, wherein the preset offset is 5% to 20%.

5. The method according to claim 1, wherein matching the encoded stream and the encoded infrared remote control code stream recorded in the infrared remote control code library comprises:

comparing a fluctuation range of code data in the encoded stream and a fluctuation range of third code data, the third code data being code data of the encoded infrared remote control code stream recorded in the infrared remote control code library; and performing comparison to determine whether the code data in the encoded stream is matched with the encoded infrared remote control code stream recorded in the infrared remote control code library if the fluctuation range of the code data in the encoded stream is in the fluctuation range of the third code data.

6. The method according to claim 1, after acquiring the infrared remote control code stream, further comprising:

preprocessing the infrared remote control code stream, a preprocessing manner comprising smoothing.

7. The method according to claim 1, wherein matching the encoded stream and the encoded infrared remote control code stream recorded in the infrared remote control code library comprises:

when the infrared remote control code library stores a standard code stream data, determining a mismatched amount of a code data in the encoded stream which is not matched with the standard code stream data in the infrared remote control code library;

when the mismatched amount is smaller than a preset amount, determining that the encoded stream is matched with the encoded infrared remote control code stream recorded in the infrared remote control code library.

8. The method according to claim 7, wherein the preset amount is determined according to the length of the code data in the encoded stream.

9. The method according to claim 1, wherein matching the encoded stream and the encoded infrared remote control code stream recorded in the infrared remote control code library comprises:
when an infrared remote control code library stores a standard code stream data, determining a mismatched code data in the encoded stream which is not matched with the standard code stream data in the infrared remote control code library, determining a weight of the mismatched code data, wherein a magnitude of the weight is directly proportional to a magnitude of a offset, the magnitude of the offset is a offset size between the mismatched code data and the standard code stream data;
comparing a numerical value obtained by adding weights corresponding to all mismatched code data with a preset threshold;
when a comparing result is that the numerical value is smaller than the preset threshold, determining that the encoded stream is matched with the encoded infrared remote control code stream recorded in the infrared remote control code library.

10. The method according to claim 1, wherein matching the encoded stream and the encoded infrared remote control code stream recorded in the infrared remote control code library comprises:
when the infrared remote control code library stores multiple frames of code streams in a preset fluctuation range, if the encoded stream is matched with at least one frame of code stream in the multiple frames of code streams, determining that the encoded stream is matched with the encoded infrared remote control code stream recorded in the infrared remote control code library.

11. The method according to claim 1, after matching the encoded stream and the encoded infrared remote control code stream recorded in the infrared remote control code library, the method further comprising:
when there is no encoded infrared remote control code stream in the infrared remote control code library which is matched with the encoded stream, adding the infrared remote control code and a corresponding device model and type into the infrared remote control code library, as to update the infrared remote control code library.

12. A computer device, comprising a memory and a processor, wherein a computer program is stored in the memory; and the processor executes the computer program to implement the following actions:
acquiring an infrared remote control code stream, the infrared remote control code stream comprising multiple pieces of code data;
statistically obtaining an occurrence frequency of each piece of code data in the infrared remote control code stream, and dividing a data region covered by the infrared remote control code stream into multiple data subregions according to the occurrence frequency of each piece of code data in the infrared remote control code stream;
performing an encoding process on the each piece of code data in the infrared remote control code stream according to a size of the each piece of code data in the infrared remote control code stream and the multiple data subregions to obtain an encoded stream; and
matching the encoded stream and an encoded infrared remote control code stream recorded in an infrared remote control code library to find a corresponding infrared remote control code stream from the infrared remote control code library;
wherein dividing the data region of the infrared remote control code stream into the multiple data subregions according to the occurrence frequencies of the code data in the infrared remote control code stream comprises:
selecting first code data and second code data from the infrared remote control code stream according to the occurrence frequencies of the code data in the infrared remote control code stream;
obtaining four pieces of partitioning code data according to the first code data, the second code data and a preset offset; and
dividing the data region of the infrared remote control code stream into five continuous data subregions according to sizes of the four pieces of partitioning code data;
wherein matching the encoded stream and the encoded infrared remote control code stream recorded in the infrared remote control code library comprises:
when a length of the code data in the encoded stream is different from a length of the encoded infrared remote control code stream recorded in the infrared remote control code library, comparing the code data in the encoded stream with code data of the encoded infrared remote control code stream of which the length is the same to the length of the code data in the encoded stream, in the encoded infrared remote control code stream recorded in the infrared remote control code library;
when a comparing result is a mismatched result, determining that the encoded stream is matched with the encoded infrared remote control code stream recorded in the infrared remote control code library.

13. The computer device according to claim 12, wherein selecting the first code data and the second code data from the infrared remote control code stream according to the occurrence frequencies of the code data comprises:
selecting code data corresponding to a maximum occurrence frequency from the infrared remote control code stream as first high-frequency code data;
obtaining a first interval according to the first high-frequency code data and the preset offset, calculating a first mean value of all code data in the first interval, and determining the first mean value as the first code data;
rejecting all the code data in the first interval from the infrared remote control code stream, and calculating code data corresponding to a maximum occurrence frequency in the infrared remote control code stream remaining after rejection as second high-frequency code data; and
obtaining a second interval according to the second high-frequency code data and the preset offset, calculating a second mean value of all code data in the second interval, and determining the second mean value as the second code data.

14. The computer device according to claim 12, wherein obtaining the four pieces of partitioning code data according to the first code data, the second code data and the preset offset comprises:

obtaining a first upper limit value and first lower limit value of a fluctuation range of the first code data according to the first code data and the preset offset; and obtaining a second upper limit value and second lower limit value of a fluctuation range of the second code data according to the second code data and the preset offset.

15. The computer device according to claim 12, wherein the preset offset is 5% to 20%.

16. The computer device according to claim 12, wherein matching the encoded stream and the encoded infrared remote control code stream recorded in the infrared remote control code library comprises:

comparing a fluctuation range of code data in the encoded stream and a fluctuation range of third code data, the third code data being code data of the encoded infrared remote control code stream recorded in the infrared remote control code library; and performing comparison to determine whether the code data in the encoded stream is matched with the encoded infrared remote control code stream recorded in the infrared remote control code library if the fluctuation range of the code data in the encoded stream is in the fluctuation range of the third code data.

17. The computer device according to claim 12, after acquiring the infrared remote control code stream, further comprising:

preprocessing the infrared remote control code stream, a preprocessing manner comprising smoothing.

18. A non-volatile computer-readable storage media, storing a computer-readable instruction, when executed by at least one processor, the computer-readable instruction causing the at least one processor to execute following actions:

acquiring an infrared remote control code stream, the infrared remote control code stream comprising multiple pieces of code data;

statistically obtaining an occurrence frequency of each piece of code data in the infrared remote control code stream, and dividing a data region covered by the infrared remote control code stream into multiple data subregions according to the occurrence frequency of each piece of code data in the infrared remote control code stream;

performing an encoding process on the each piece of code data in the infrared remote control code stream according to a size of the each piece of code data in the infrared remote control code stream and the multiple data subregions to obtain an encoded stream; and matching the encoded stream and an encoded infrared remote control code stream recorded in an infrared remote control code library to find a corresponding infrared remote control code stream from the infrared remote control code library;

wherein dividing the data region of the infrared remote control code stream into the multiple data subregions according to the occurrence frequencies of the code data in the infrared remote control code stream comprises:

selecting first code data and second code data from the infrared remote control code stream according to the occurrence frequencies of the code data in the infrared remote control code stream;

obtaining four pieces of partitioning code data according to the first code data, the second code data and a preset offset; and dividing the data region of the infrared remote control code stream into five continuous data subregions according to sizes of the four pieces of partitioning code data;

wherein matching the encoded stream and the encoded infrared remote control code stream recorded in the infrared remote control code library comprises:

when a length of the code data in the encoded stream is different from a length of the encoded infrared remote control code stream recorded in the infrared remote control code library, comparing the code data in the encoded stream with code data of the encoded infrared remote control code stream of which the length is the same to the length of the code data in the encoded stream, in the encoded infrared remote control code stream recorded in the infrared remote control code library;

when a comparing result is a mismatched result, determining that the encoded stream is matched with the encoded infrared remote control code stream recorded in the infrared remote control code library.

19. The non-volatile computer-readable storage media according to claim 18, wherein selecting the first code data and the second code data from the infrared remote control code stream according to the occurrence frequencies of the code data comprises:

selecting code data corresponding to a maximum occurrence frequency from the infrared remote control code stream as first high-frequency code data;

obtaining a first interval according to the first high-frequency code data and the preset offset, calculating a first mean value of all code data in the first interval, and determining the first mean value as the first code data;

rejecting all the code data in the first interval from the infrared remote control code stream, and calculating code data corresponding to a maximum occurrence frequency in the infrared remote control code stream remaining after rejection as second high-frequency code data; and obtaining a second interval according to the second high-frequency code data and the preset offset, calculating a second mean value of all code data in the second interval, and determining the second mean value as the second code data.

20. The non-volatile computer-readable storage media according to claim 18, wherein obtaining the four pieces of partitioning code data according to the first code data, the second code data and the preset offset comprises:

obtaining a first upper limit value and first lower limit value of a fluctuation range of the first code data according to the first code data and the preset offset; and obtaining a second upper limit value and second lower limit value of a fluctuation range of the second code data according to the second code data and the preset offset.

* * * * *